(12) United States Patent
Kim et al.

(10) Patent No.: US 8,962,747 B2
(45) Date of Patent: Feb. 24, 2015

(54) RESIST UNDERLAYER COMPOSITION AND PROCESS OF PRODUCING INTEGRATED CIRCUIT DEVICES USING THE SAME

(75) Inventors: Mi-Young Kim, Uiwang-si (KR); Woo-Jin Lee, Uiwang-si (KR); Kwen-Woo Han, Uiwang-si (KR); Han-Song Lee, Uiwang-si (KR); Sang-Kyun Kim, Uiwang-si (KR); Jong-Seob Kim, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/539,971

(22) Filed: Jul. 2, 2012

(65) Prior Publication Data

US 2012/0270981 A1    Oct. 25, 2012

Related U.S. Application Data

(63) Continuation of application No. PCT/KR2010/008852, filed on Dec. 10, 2010.

(30) Foreign Application Priority Data

Dec. 31, 2009    (KR) .................. 10-2009-0136189

(51) Int. Cl.
```
C08L 83/00      (2006.01)
H01L 21/033     (2006.01)
G03F 7/075      (2006.01)
G03F 7/09       (2006.01)
H01L 21/02      (2006.01)
```
(52) U.S. Cl.
CPC .......... *H01L 21/0332* (2013.01); *G03F 7/0752* (2013.01); *G03F 7/091* (2013.01); *H01L 21/02126* (2013.01); *H01L 21/02216* (2013.01); *H01L 21/02282* (2013.01)
USPC ............................ 524/588; 524/317; 430/313

(58) Field of Classification Search
None
See application file for complete search history.

(56) References Cited

U.S. PATENT DOCUMENTS

| | | | |
|---|---|---|---|
| 2004/0109950 A1* | 6/2004 | Adams et al. ................. | 427/387 |
| 2007/0238300 A1 | 10/2007 | Ogihara et al. | |
| 2008/0118875 A1* | 5/2008 | Kim et al. ..................... | 430/327 |
| 2008/0241748 A1 | 10/2008 | Motallebi et al. | |
| 2009/0148789 A1* | 6/2009 | Amara et al. ............. | 430/270.1 |
| 2009/0226824 A1 | 9/2009 | Kim et al. | |

FOREIGN PATENT DOCUMENTS

| | | | |
|---|---|---|---|
| CN | 101302346 A | | 11/2008 |
| CN | 101490621 A | | 7/2009 |
| JP | 2000-250218 A | | 9/2000 |
| KR | 10 2002-0064465 A | | 8/2002 |
| KR | 10 2007-0101148 A | | 10/2007 |
| KR | 10 2007-0122250 A | | 12/2007 |
| KR | 10-0792045 B1 | | 12/2007 |
| KR | 10-2006-0115411 | * | 1/2008 |
| KR | 10-0796047 B1 | | 1/2008 |
| KR | 10 2008-0089303 A | | 10/2008 |

OTHER PUBLICATIONS

Chinese Search Report in CN 201080060219.0, dated Feb. 19, 2013.

* cited by examiner

*Primary Examiner* — Susannah Chung
*Assistant Examiner* — Robert T Butcher
(74) *Attorney, Agent, or Firm* — Lee & Morse, P.C.

(57) ABSTRACT

A resist underlayer composition includes a solvent, and an organosilane condensation polymerization product of: a compound represented by the following Chemical Formula 1, a compound represented by the following Chemical Formula 2, and a compound represented by the following Chemical For-
mula 3, $[R^1O]_3Si—X$    [Chemical Formula 1]

$[R^2O]_3Si—R^3$    [Chemical Formula 2]

$[R^4O]_3Si—Si[OR^5]_3$.    [Chemical Formula 3]

5 Claims, 1 Drawing Sheet

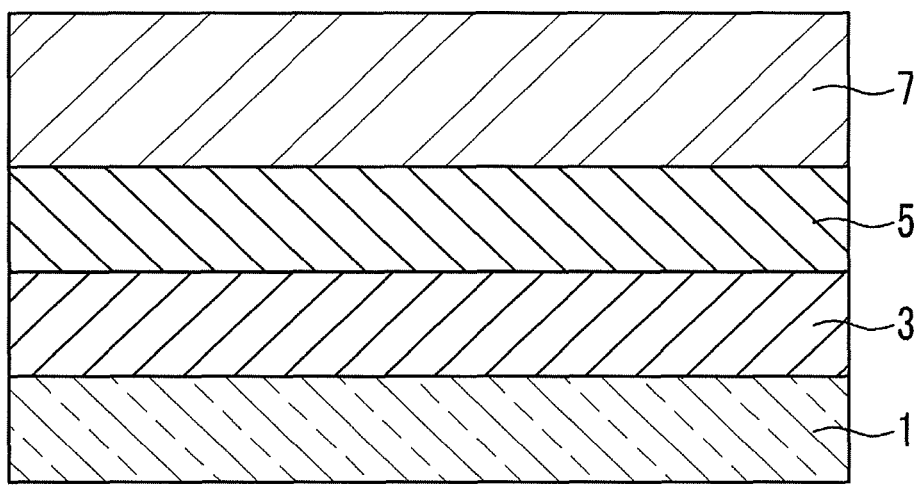

RESIST UNDERLAYER COMPOSITION AND PROCESS OF PRODUCING INTEGRATED CIRCUIT DEVICES USING THE SAME

CROSS-REFERENCE TO RELATED APPLICATIONS

This application is a continuation of pending International Application No. PCT/KR2010/008852, entitled "Resist Underlayer Composition and Process of Producing Integrated Circuit Devices Using the Same," which was filed on Dec. 10, 2010, the entire contents of which are hereby incorporated by reference for all purposes.

This application claims priority under 35 U.S.C. §119 to Korean Patent Application No. 10-2009-0136189, filed on Dec. 31, 2009, the entire contents of which are hereby incorporated by reference for all purposes.

1. Field

Embodiments relate to a resist underlayer composition and a process of producing a semiconductor integrated circuit device.

2. Description of the Related Art

Generally, a lithography process may minimize reflection between a resist layer and a substrate in order to increase a resolution. For this reason, an anti-reflective coating (ARC) may be used between the resist layer and the substrate to improve the resolution. However, the anti-reflective coating material may be similar to a resist material in terms of basic composition. Thus, the anti-reflective coating material may exhibit relatively poor etch selectivity with respect to a resist layer with an image imprinted therein. Therefore, an additional lithography process may be required in a subsequent etching process.

SUMMARY

Embodiments are directed to a resist underlayer composition, including a solvent, and an organosilane condensation polymerization product of: a compound represented by the following Chemical Formula 1, a compound represented by the following Chemical Formula 2, and a compound represented by the following Chemical Formula 3.

$$[R^1O]_3Si—X \qquad \text{[Chemical Formula 1]}$$

In Chemical Formula 1, $R^1$ may be a substituted or unsubstituted C1 to C6 alkyl group, and X may be a substituted or unsubstituted C6 to C30 aryl group.

$$[R^2O]_3Si—R^3 \qquad \text{[Chemical Formula 2]}$$

In Chemical Formula 2, $R^2$ may be a substituted or unsubstituted C1 to C6 alkyl group, and $R^3$ may be a substituted or unsubstituted C1 to C12 alkyl group.

$$[R^4O]_3Si—Si[OR^5]_3 \qquad \text{[Chemical Formula 3]}$$

In Chemical Formula 3, $R^4$ and $R^5$ may be the same or different, and may be a substituted or unsubstituted C1 to C6 alkyl group.

The organosilane condensation polymerization product may have a weight average molecular weight of about 2,000 to about 50,000.

The organosilane condensation polymerization product may be included in an amount of about 0.1 to about 50 wt % based on a total amount of the resist underlayer composition.

The resist underlayer composition may further include a cross-linking agent, a radical stabilizer, a surfactant, or a combination thereof.

The resist underlayer composition may further include a cross-linking catalyst of pyridinium p-toluene sulfonate, amidosulfobetain-16, ammonium(–)-camphor-10-sulfonic acid ammonium salt, ammonium formate, alkyltriethylammonium formate, pyridinium formate, tetrabutyl ammonium acetate, tetrabutyl ammonium azide, tetrabutyl ammonium benzoate, tetrabutyl ammonium bisulfate, tetrabutyl ammonium bromide, tetrabutyl ammonium chloride, tetrabutyl ammonium cyanide, tetrabutyl ammonium fluoride, tetrabutyl ammonium iodide, tetrabutyl ammonium sulfate, tetrabutyl ammonium nitrate, tetrabutyl ammonium nitrite, tetrabutyl ammonium p-toluene sulfonate, tetrabutyl ammonium phosphate, or a combination thereof.

BRIEF DESCRIPTION OF THE DRAWING

Features will become apparent to those of skill in the art by describing in detail exemplary embodiments with reference to the attached drawing in which:

FIG. 1 illustrates a cross-sectional view of a multi-layer formed by sequentially stacking a first resist underlayer, a second resist underlayer, and a resist layer on a substrate.

| <Description of Reference Numerals Indicating Primary Elements in the Drawing> | |
|---|---|
| 1: substrate | 3: first resist underlayer |
| 5: second resist underlayer | 7: resist layer |

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figure, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, when specific definition is not otherwise provided, the term "substituted" refers to one substituted with a C1 to C6 alkyl group or a C6 to C12 aryl group. In addition, an alkyl group refers to a C1 to C10 alkyl group, when it has no particular definition as to the number of carbon atoms.

The resist underlayer composition according to an embodiment includes a solvent and an organosilane condensation polymerization product. In an example embodiment, the organosilane condensation polymerization product is produced by condensing and polymerizing: a compound represented by the following Chemical Formula 1, a compound represented by the following Chemical Formula 2, and a compound represented by the following Chemical Formula 3.

$$[R^1O]_3Si—X \qquad \text{[Chemical Formula 1]}$$

In Chemical Formula 1, $R^1$ is a substituted or unsubstituted C1 to C6 alkyl group, and X is a substituted or unsubstituted C6 to C30 aryl group.

$$[R^2O]_3Si—R^3 \qquad \text{[Chemical Formula 2]}$$

In Chemical Formula 2, $R^2$ is a substituted or unsubstituted C1 to C6 alkyl group, and $R^3$ is a substituted or unsubstituted C1 to C12 alkyl group.

$$[R^4O]_3Si—Si[OR^5]_3 \qquad \text{[Chemical Formula 3]}$$

In Chemical Formula 3, $R^4$ and $R^5$ are the same or different, and are a substituted or unsubstituted C1 to C6 alkyl group.

The alkyl group may be a linear or branched alkyl group.

In an embodiment, the organosilane condensation polymerization product may be produced though a hydrolysis and/or condensation polymerization reaction of about 0.1 to about 90 parts by weight of the compound of Chemical Formula 1, about 0.1 to about 90 parts by weight of the compound of Chemical Formula 2, and about 0.1 to about 90 parts by weight of the compound of Chemical Formula 3, based on 100 parts by weight of a sum of the compounds of the above Chemical Formulae 1 to 3. In an embodiment, the compound of Chemical Formula 1 may be used in an amount of 0.1 to 30 parts by weight, the compound of Chemical Formula 2 may be used in an amount of 0.1 to 50 parts by weight, and the compound of Chemical Formula 3 may be used in an amount of 0.1 to 90 parts by weight.

When the compound of the above Chemical Formula 1 is used within the above range, an underlayer having anti-reflective properties and sufficient etching selectivity may be provided by the aromatic ring, which has an absorption spectrum at a DUV (deep UV) region. The amount of the aromatic ring may be adjusted to provide an underlayer composition having a desirable absorption and a refractive index at a predetermined wavelength.

When the compound of the above Chemical Formula 2 is used within the above range, high storage stability and sufficient absorbance of the polycondensation product may be obtained.

When the compound of the above Chemical Formula 3 is used within the above range, sufficient etching resistance for oxygen plasma may be ensured.

An acid catalyst or base catalyst may be used to facilitate the acquisition of the organosilane condensation polymerization product having a desired molecular weight by properly controlling the speed of a hydrolysis reaction or a condensation polymerization reaction of the above Chemical Formulae. A suitable acid catalyst or base catalyst may be used. In an embodiment, the acid catalyst may be selected from the group of hydrofluoric acid, hydrochloric acid, bromic acid, iodic acid, nitric acid, sulfuric acid, p-toluenesulfonic acid monohydrate, diethylsulfate, 2,4,4,6-tetrabromocyclohexadienone, benzoin tosylate, 2-nitrobenzyl tosylate, alkyl esters of organic sulfonic acids, and a combination thereof. Also, the base catalyst may be selected from the group of an alkylamine such as triethylamine and diethylamine, ammonia, sodium hydroxide, potassium hydroxide, pyridine, and a combination thereof. The acid catalyst or the base catalyst may be used in an amount of, e.g., about 0.001 to about 5 parts by weight based on 100 parts by weight of the entire weight of compounds producing the organosilane condensation polymerization product in order to acquire a condensation polymerization product of a desired molecular weight by properly controlling a reaction rate.

The organosilane condensation polymerization product may be a condensation polymerization product of the compounds represented by the following Chemical Formulae 4 to 6, which are hydrolyzed compounds of the compounds represented by the above Chemical Formulae 1 to 3.

$$[HO]_a[R^1O]_{(3-a)}Si—X \qquad \text{[Chemical Formula 4]}$$

In Chemical Formula 4, $R^1$ is a substituted or unsubstituted C1 to C6 alkyl group, X is a substituted or unsubstituted C6 to C30 aryl group, and a is larger than 0 and less than or equal to 3.

$$[HO]_b[R^2O]_{(3-b)}Si—R^3 \qquad \text{[Chemical Formula 5]}$$

In Chemical Formula 4, $R^2$ is a substituted or unsubstituted C1 to C6 alkyl group, $R^3$ is a substituted or unsubstituted C1 to C12 alkyl group, and b is larger than 0 and less than or equal to 3.

$$[HO]_d[R^4O]_{(3-d)}Si—Si[OH]_e[R^5O]_{(3-e)} \qquad \text{[Chemical Formula 6]}$$

In Chemical Formula 6, $R^4$ and $R^5$ are the same or different, and are a substituted or unsubstituted C1 to C6 alkyl group, and d and e are independently larger than 0 and less than or equal to 3.

The alkyl group may be a linear or branched alkyl group.

The condensation polymerization product according to an embodiment may be represented by the following Chemical Formula 7.

$$\{(XSiO_{1.5})_p(R^3SiO_{1.5})_q(O_{1.5}Si—SiO_{1.5})_r\}_n \qquad \text{[Chemical Formula 7]}$$

In Chemical Formula 7, $R^3$ and X are the same as in Chemical Formulae 2 and 3, $0.001 \leq p \leq 0.9$, $0.001 \leq q \leq 0.9$, $0.001 \leq r \leq 0.9$, $p+q+r=1$, and n is about 50 to about 300.

The organosilane condensation polymerization product may have a weight average molecular weight of about 2,000 to about 50,000. In an embodiment, the organosilane condensation polymerization product may have a weight average molecular weight of about 3,000 to about 20,000 in consideration of a coating performance on a substrate and to prevent generation of gel.

Also, the organosilane condensation polymerization product may be included in an amount of about 0.1 to about 50 wt % based on 100 wt % of the entire resist underlayer composition. In an embodiment, the organosilane condensation polymerization product may be included in an amount of about 0.5 to about 30 wt % in consideration of a coating performance on a substrate.

Also, in the resist underlayer composition according to an embodiment, the solvent may help prevent voids, and may help dry a film slowly to thereby improve a planarization property. A suitable solvent may be used as the solvent. In an embodiment, a solvent may be used that has a high boiling point, volatilizing at a temperature slightly lower than a temperature where the resist underlayer composition according to an embodiment is coating, dried, and solidified. Examples of the solvent include toluene, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, g-butyrolactone, methyl isobutyl ketone, or a combination thereof.

The resist underlayer composition may further include an additive selected from the group of a cross-linking agent, a radical stabilizer, a surfactant, and a combination thereof.

In an embodiment, the resist underlayer composition further includes a cross-linking catalyst of, e.g., pyridinium p-toluene sulfonate, amidosulfobetain-16, ammonium(−)-camphor-10-sulfonic acid ammonium salt, ammonium formate, alkyltriethylammonium formate, pyridinium formate, tetrabutyl ammonium acetate, tetrabutyl ammonium azide, tetrabutyl ammonium benzoate, tetrabutyl ammonium bisulfate, tetrabutyl ammonium bromide, tetrabutyl ammonium chloride, tetrabutyl ammonium cyanide, tetrabutyl ammonium fluoride, tetrabutyl ammonium iodide, tetrabutyl ammonium sulfate, tetrabutyl ammonium nitrate, tetrabutyl ammonium nitrite, tetrabutyl ammonium p-toluene sulfonate, tetrabutyl ammonium phosphate, or a combination thereof.

The cross-linking catalyst may be added alone or along with the additive (which may be selected from the group of the cross-linking agent, the radical stabilizer, the surfactant, and the combination thereof) to the composition including the organosilane polymerization product and the solvent.

When the resist underlayer composition further includes the additive, the additive may be included in an amount of about 0.0001 to about 1 part by weight based on 100 parts by weight of the organosilane condensation polymerization product. This may provide a desirable effect in terms of storage stability.

The resist underlayer composition according to an embodiment may be capable of easily controlling a refractive index and an absorbance within a wavelength range of lower than about 250 nm. Thereby, a resist underlayer having excellent anti-reflective properties and etching selectivity may be provided.

In general, when absorbance increases, a refractive index is also increased. However, using the resist underlayer composition according to an embodiment, the optical property may be controlled to be within a desirable range due to the compound represented by the above Chemical Formula 1, and thus a low refractive index may be realized at low absorbance.

A method of forming a patterned material layer can be carried out in accordance with the following procedure.

First, a material (e.g., aluminum or silicon nitride (SiN)) to be patterned may be applied to a substrate, e.g., a silicon substrate, by a suitable technique. The material to be patterned may be, e.g., an electrically conductive, semi-conductive, magnetic, or insulating material.

A first resist underlayer including an organic material may be provided on the patterned material. The first resist underlayer may include an organic material including carbon, hydrogen, oxygen, and the like, at a thickness of about 200 Å to about 12000 Å. In various implementations, the first resist underlayer may be formed according to various thicknesses using various materials.

Thereafter, the resist underlayer composition according to an embodiment may be spin-coated to a thickness of, e.g., about 100 Å to about 4000 Å, and heat treated to form a second resist underlayer.

A heat treatment process for forming the second resist underlayer may be performed at, e.g., a high temperature of about 250° C. to about 500° C. When heat treatment is performed at the above range, a Si content in an underlayer may be increased to provide a dense underlayer.

The heat treatment process may be performed by carrying out a first heat treatment process at a low temperature and a secondary heat treatment process at a high temperature. The first heat treatment process may be performed at about 150° C. to about 250° C. and the secondary heat treatment process may be performed at about 275° C. to about 500° C.

A radiation-sensitive imaging layer may be formed on the second resist under-layer. Light exposure and development may be performed to form a pattern on the imaging layer. The imaging layer and anti-reflective layer may be selectively removed to expose portions of the material layer, and dry etching may be performed using an etching gas. Examples of the etching gas include $CHF_3$, $CH_2F_2$, $CF_4$, $CH_4$, $N_2$, $O_2$, $Cl_2$, $BCl_3$, or a mixed gas. After forming a patterned material layer, remaining photoresist material may be removed using a generally-used photoresist stripper. Through the method, a patterned device may be provided.

The device may be a semiconductor integrated circuit device. For example, the method of an embodiment may be applied to the areas like a patterned material layer structure such as a metal wiring line, a hole for contact or bias, an insulation section such as a multi-mask trench or shallow trench insulation, a trench for a capacitor structure such as designing in an integrated circuit device, etc. In an implementation, the method may be applied to formation of a patterned layer of oxide, nitride, polysilicon, chromium, etc. Embodiments may be implemented with various lithographic methods and device structures.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Comparative Example 1

30.32 g of methyltrimethoxysilane, 11.0 g of phenyltrimethoxysilane, and 98.6 g of bis(trimethoxysilyl)methane were put into a 1 L 4-neck flask including a mechanical agitator, a condenser, a dropping funnel, and a nitrogen gas injection tube, and dissolved in 560 g of PGMEA (propylene glycol monomethyl ether acetate), and then 32 g of 0.5% nitric acid aqueous solution was added thereto. Then, the resultant was reacted for one hour and applied with a negative pressure to remove methanol and ethanol produced therein. Subsequently, the solution was reacted at about 50° C. for two days. After the reaction, 98 g of PGMEA was added into 2 g of the obtained organosilane condensation polymerization product solution to prepare a diluted solution.

0.004 g of pyridinium p-toluene sulfonate was added to the diluted solution to thereby prepare a resist underlayer composition.

The resist underlayer composition was applied to a silicon wafer through a spin-coating method, and the silicon wafer coated with resist underlayer composition was baked at a temperature of 240° C. for 60 seconds and additionally baked at a temperature of 400° C. for 120 seconds to thereby form a film having a thickness of 390 Å.

Example 1

37 g of methyltrimethoxysilane, 13.4 g of phenyltrimethoxysilane, and 110 g of hexaethoxydisilane were put into a 1 L 4-neck flask including a mechanical agitator, a condenser, a dropping funnel, and a nitrogen gas injection tube and dissolved in 320 g of PGMEA (propylene glycol monomethyl ether acetate), and then 38 g of 0.5% nitric acid aqueous solution was added thereto. Then, the resultant was reacted for one hour and applied with a negative pressure to remove methanol and ethanol produced therein. Subsequently, the solution was reacted at about 50° C. for two days. After the reaction, 98 g of PGMEA was added into 2 g of the obtained organosilane condensation polymerization product solution (weight average molecular weight=5,000) to prepare a diluted solution.

0.004 g of pyridinium p-toluene sulfonate was added to the diluted solution to thereby prepare a resist underlayer composition.

The resist underlayer composition was applied to a silicon wafer through a spin-coating method, and the silicon wafer coated with resist underlayer composition was baked at a temperature of about 240° C. for about 60 seconds and additionally baked at a temperature of about 400° C. for about 120 seconds to thereby form a film having a thickness of about 390 Å.

Example 2

37 g of methyltrimethoxysilane, 13.4 g of phenyltrimethoxysilane, and 110 g of hexaethoxydisilane were put into a 1 L 4-neck flask including a mechanical agitator, a condenser, a dropping funnel, and a nitrogen gas injection tube and dissolved in 320 g of PGMEA (propylene glycol monomethyl ether acetate), and then 76 g of 0.5% nitric acid aqueous solution was added thereto. Then, the resultant was reacted for one hour and applied with a negative pressure to remove methanol and ethanol produced therein. Subsequently, the solution was reacted at about 50° C. for two days. After the reaction, 98 g of PGMEA was added into 2 g of the obtained organosilane condensation polymerization product solution (weight average molecular weight=10,000) to prepare a diluted solution.

0.004 g of pyridinium p-toluene sulfonate was added to the diluted solution to thereby prepare a resist underlayer composition.

The resist underlayer composition was applied to a silicon wafer through a spin-coating method, and the silicon wafer coated with resist underlayer composition was baked at a temperature of about 240° C. for about 60 seconds and additionally baked at a temperature of about 400° C. for about 120 seconds to thereby form a film having a thickness of about 390 Å.

Example 3

37 g of methyltrimethoxysilane, 13.4 g of phenyltrimethoxysilane, and 110 g of hexaethoxydisilane were put into a 1 L 4-neck flask including a mechanical agitator, a condenser, a dropping funnel, and a nitrogen gas injection tube and dissolved in 320 g of PGMEA (propylene glycol monomethyl ether acetate), and then 137 g of 0.5% nitric acid aqueous solution was added thereto. Then, the resultant was reacted for one hour and applied with a negative pressure to remove methanol and ethanol produced therein. Subsequently, the solution was reacted at about 50° C. for two days. After the reaction, 98 g of PGMEA was added into 2 g of the obtained organosilane condensation polymerization product solution (weight average molecular weight=16,500) to prepare a diluted solution.

0.004 g of pyridinium p-toluene sulfonate was added to the diluted solution to thereby prepare a resist underlayer composition.

The resist underlayer composition was applied to a silicon wafer through a spin-coating method, and the silicon wafer coated with resist underlayer composition was baked at a temperature of 240° C. for 60 seconds and additionally baked at a temperature of 400° C. for 120 seconds to thereby form a film having a thickness of 390 Å.

Measuring Refractive Index and Absorbance

The refractive index (n) and absorbance (extinction coefficient, k) of the films baked at 240° C. through and additionally baked at 400° were measured using an Ellipsometer (J. A. Woollam). Results for Comparative Example 1 and Example 1 are shown in Table 1.

TABLE 1

|  | Refractive index (193 nm) | | Extinction coefficient (193 nm) | |
| --- | --- | --- | --- | --- |
|  | 240° C. | 400° C. | 240° C. | 400° C. |
| Comparative Example 1 | 1.69 | 1.69 | 0.14 | 0.14 |
| Example 1 | 1.77 | 1.64 | 0.18 | 0.14 |

Referring to Table 1, the film using a general organosilane condensation polymerization product according to Comparative Example 1 did not show changes of refractive index and extinction coefficient between a film baked at a low temperature of 240° C. and a film baked at a high temperature of 400° C. On the other hand, the film using the organosilane condensation polymerization product according to Example 1 showed changes of refractive index and extinction coefficient between a film baked at a low temperature of 240° C. and a film baked at a high temperature of 400° C. From the results, it is apparent that the refractive index and extinction coefficient of the film formed using the organosilane condensation polymerization product according to Example 1 can be controlled in accordance with a baking temperature.

Contact Angle

Contact angles of the films according to Comparative Example 1 and Examples 1 to 3 were measured. 3 μl of water was dripped on five points of each surface using DAS-100 (KRAUSS Co.) and angles between each surface and water drops were measured. As a catalyst used during synthesis of the organosilane condensation polymerization product increased, more hydrophilicity was shown.

TABLE 2

|  | Contact angle (degree) |
| --- | --- |
| Comparative Example 1 | 69 |
| Example 1 | 74 |
| Example 2 | 69 |
| Example 3 | 58 |

Elemental Analysis

Elemental analysis of the thin films according to Comparative Example 1 and Examples 1 to 3 was performed using XPS (X-ray photoelectron spectroscopy) analysis using ESCA-2000. Kinetic energy of internal electrons emitted by photoelectric effect through X-ray radiation on each surface was measured to obtain a binding energy of electrons, and to determine kinds of elements in the samples.

TABLE 3

|  | Elemental analysis result (%) | | |
| --- | --- | --- | --- |
| XPS | Si | C | O |
| Comparative Example 1 | 42.21 | 23.49 | 34.29 |
| Example 1 | 47.76 | 12.25 | 39.99 |
| Example 2 | 48.35 | 13.09 | 38.56 |
| Example 3 | 49.95 | 10.02 | 40.03 |

As shown in Table 3, the films according to Examples 1 to 3 included relatively high amounts of silicon (Si) and oxygen (O) and low amount of carbon (C) compared with the film according to Comparative Example 1. A high amount of Si is helpful to provide a dense film, which may result in an improvement of etching resistance.

Etching Rate

The silicon wafers according to Comparative Example 1 and Examples 1 to 3 were dry-etched for 15 seconds under an etching condition of 60 mTorr, 270 W/0 W, 20 sccm $N_2$, 40 sccm $O_2$, and 200 sccm Ar, and then their thicknesses were measured to calculate an etching rate (etched thickness per unit time). $N_2$ and Ar were used as flowing gases, and $O_2$ was used as a main etching gas.

TABLE 4

|  | Etching Rate (Å/sec) |
| --- | --- |
| Comparative Example 3 | 6.8 |
| Example 1 | 5.8 |
| Example 2 | 3.5 |
| Example 3 | 2.4 |

As shown in Table 4, the films according to Examples 1 to 3 showed excellent etching resistance for $O_2$ plasma compared with the film according to Comparative Example 1.

By way of summation and review, general resist materials may not have sufficient resistance to an etching process. When a resist layer is thin, when a substrate to be etched is thick, when an etch depth is required to be deep, or when a particular etchant is required for a particular substrate, a resist underlayer may be used. The resist underlayer may include two layers (bilayer) having an excellent etch selectivity. For example, referring to FIG. 1, a first resist underlayer 3, which may be formed of an organic material, may be formed on a substrate 1 (which may have, e.g., a silicon oxide layer), and a second resist underlayer 5 may be formed on the first resist underlayer 3. The second resist underlayer 5 may be formed using a resist underlayer composition according to an embodiment. Next, a resist layer 7 may be formed on the second resist underlayer 5. The second resist underlayer 5 may have a higher etch selectivity with respect to the resist layer 7 than the substrate 1. Thus, a pattern may be easily transferred even when a thin resist layer 7 is used. The first resist underlayer 3 may be etched and the pattern transferred by using the second resist underlayer 5, with a pattern transferred thereto, as a mask. Then, the pattern may be transferred to the substrate 1 by using the first resist underlayer 3 as a mask. Thus, a substrate may be etched to a desired depth by using a thinner resist layer 7.

The second resist underlayer may be a layer formed under the resist layer and may function as an anti-reflective coating material. The second resist underlayer may provide an optical property such that it absorbs light emitted from an exposer and does not reflect the light. Particularly, as semiconductor devices are miniaturized to have a line width of tens of nanometers, semiconductor fabrication processes require a delicate control of optical properties. The second resist underlayer 5 may provide control over refractive index and absorbance, which may help enable realization of a high-resolution resist pattern.

As described above, embodiments may provide a resist underlayer composition amenable to easily adjusting a refractive index and absorbance, and providing excellent anti-reflective properties. Embodiments may also provide a resist underlayer composition for producing a dense underlayer, and the composition may provide excellent coating properties and storage stability, and good curing. The resist underlayer composition may be amenable to easily control refractive index and absorbance within a wavelength range of lower than about 250 nm to improve anti-reflective properties, and may provide good coating properties and storage-stability, and may provide a dense resist underlayer. Thus, embodiments may help enable fabrication of a semiconductor integrated circuit device with fine patterns.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A resist underlayer composition, comprising:
a solvent; and
an organosilane condensation polymerization product, the organosilane condensation polymerization product being a condensation polymerization product of a mixture of silicon-containing compounds, the mixture of silicon-containing compounds consisting of: a compound represented by the following Chemical Formula 1, a compound represented by the following Chemical Formula 2, and a compound represented by the following Chemical Formula 3:

$[R^1O]_3Si-X$            [Chemical Formula 1]

wherein, in Chemical Formula 1, $R^1$ is a substituted or unsubstituted C1 to C6 alkyl group, and X is a substituted or unsubstituted C6 to C30 aryl group, $[R^2O]_3Si-R^3$            [Chemical Formula 2]

wherein, in Chemical Formula 2, $R^2$ is a substituted or unsubstituted C1 to C6 alkyl group, and $R^3$ is a substituted or unsubstituted C1 to C12 alkyl group, $[R^4O]_3Si-Si[OR^5]_3$            [Chemical Formula 3]

wherein, in Chemical Formula 3, $R^4$ and $R^5$ are the same or different, and are a substituted or unsubstituted C1 to C6 alkyl group,
wherein the amount of the compound represented by Chemical Formula 1 is about 0.1 to about 30 parts by weight, the amount of the compound represented by Chemical Formula 2 is about 0.1 to about 50 parts by weight, and the amount of the compound represented by Chemical Formula 3 is about 0.1 to about 90 parts by weight, provided that the total amount of the compounds represented by Chemical Formula 1, Chemical Formula 2, and Chemical Formula 3 is 100 parts by weight, and
wherein the organosilane condensation polymerization product is included in an amount of about 0.1 to about 50 wt % based on a total amount of the resist underlayer composition.

2. The resist underlayer composition as claimed in claim 1, wherein the organosilane condensation polymerization product has a weight average molecular weight of about 2,000 to about 50,000.

3. The resist underlayer composition as claimed in claim 1, further comprising a cross-linking agent, a radical stabilizer, a surfactant, or a combination thereof.

4. The resist underlayer composition as claimed in claim 1, further comprising a cross-linking catalyst of pyridinium p-toluene sulfonate, amidosulfobetain-16, ammonium(−)-camphor-10-sulfonic acid ammonium salt, ammonium formate, alkyltriethylammonium formate, pyridinium formate, tetrabutyl ammonium acetate, tetrabutyl ammonium azide, tetrabutyl ammonium benzoate, tetrabutyl ammonium bisulfate, tetrabutyl ammonium bromide, tetrabutyl ammonium chloride, tetrabutyl ammonium cyanide, tetrabutyl ammonium fluoride, tetrabutyl ammonium iodide, tetrabutyl ammonium sulfate, tetrabutyl ammonium nitrate, tetrabutyl ammonium nitrite, tetrabutyl ammonium p-toluene sulfonate, tetrabutyl ammonium phosphate, or a combination thereof.

5. The resist underlayer composition as claimed in claim 1, wherein an amount of silicon in the organosilane condensation polymerization product is about 48% to 50%, based on a total amount of silicon, carbon, and oxygen in the organosilane condensation polymerization product.

\* \* \* \* \*